(12) United States Patent
Hirose et al.

(10) Patent No.: US 7,291,538 B2
(45) Date of Patent: Nov. 6, 2007

(54) SEMICONDUCTOR MEMORY DEVICE AND MANUFACTURING METHOD OF THE SAME

(75) Inventors: Masakazu Hirose, Hyogo (JP); Fukashi Morishita, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 21 days.

(21) Appl. No.: 11/236,668

(22) Filed: Sep. 28, 2005

(65) Prior Publication Data

US 2006/0024918 A1    Feb. 2, 2006

Related U.S. Application Data

(62) Division of application No. 10/224,317, filed on Aug. 21, 2002, now Pat. No. 6,965,148.

(30) Foreign Application Priority Data

Sep. 26, 2001    (JP)    ............... 2001-293174

(51) Int. Cl.
*H01L 21/762*    (2006.01)
(52) U.S. Cl. ................ 438/406; 438/459; 257/E21.567
(58) Field of Classification Search ........ 257/E21.537, 257/E21.538, E21.567; 438/155, 165, 406
See application file for complete search history.

(56) References Cited

U.S. PATENT DOCUMENTS

| 5,427,052 A | * | 6/1995 | Ohta et al. ........... 438/8 |
| 5,612,230 A | | 3/1997 | Yuzurihara et al. |
| 5,811,283 A | | 9/1998 | Sun |
| 5,877,978 A | | 3/1999 | Morishita et al. |
| 5,897,351 A | | 4/1999 | Forbes |
| 6,023,089 A | | 2/2000 | Kang |
| 6,429,099 B1 | * | 8/2002 | Christensen et al. ........ 438/480 |
| 6,437,405 B2 | | 8/2002 | Kim |
| 6,509,586 B2 | | 1/2003 | Awano |
| 6,514,809 B1 | | 2/2003 | Xiang |

FOREIGN PATENT DOCUMENTS

| DE | 196 54 280 A1 | | 7/1997 |
| EP | 0 710 980 A2 | | 5/1996 |
| JP | 05021764 A | * | 1/1993 |
| JP | 8-293608 | | 11/1996 |
| JP | 10-125903 | | 5/1998 |

* cited by examiner

*Primary Examiner*—Wael Fahmy
*Assistant Examiner*—Jennifer M Dolan
(74) *Attorney, Agent, or Firm*—McDermott Will & Emery LLP

(57) ABSTRACT

In this semiconductor memory device, a potential clamping region having no insulation layer formed therein is provided in an insulation layer. More specifically, the potential clamping region is formed under a body portion at a position near a first impurity region, and extends to a first semiconductor layer. A body fixing portion is formed in a boundary region between the body portion and the potential clamping region. This structure enables improvement in operation performance without increasing the layout area in the case where a DRAM cell is formed in a SOI (Silicon On Insulator) structure.

1 Claim, 7 Drawing Sheets

FIG. 14 PRIOR ART
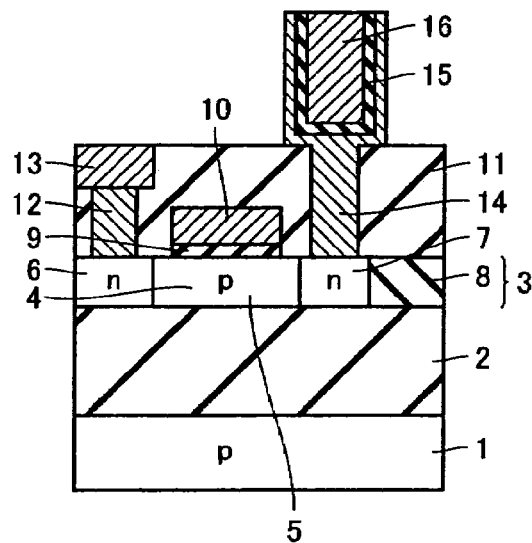
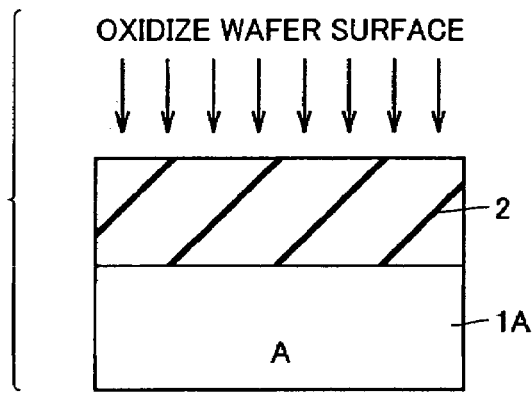
FIG. 15 PRIOR ART
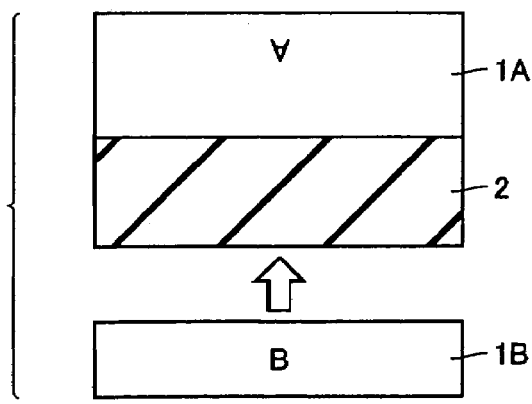
FIG. 16 PRIOR ART

SEMICONDUCTOR MEMORY DEVICE AND MANUFACTURING METHOD OF THE SAME

RELATED APPLICATIONS

This application is a divisional of application Ser. No. 10/224,317, filed Aug. 21, 2002 now U.S. Pat. No. 6,965,148, which claims priority of Japanese Application No. 2001-293174, filed Sep. 26, 2001, the contents of which are hereby incorporated by reference.

BACKGROUND OF THE INVENTION

1. Field of the Invention

The present invention generally relates to a semiconductor memory device and a manufacturing method of the same. More particularly, the present invention relates to a semiconductor memory device enabling microfabrication of the semiconductor memory device and improvement in performance thereof, and a manufacturing method of the same.

2. Description of the Background Art

A conventional DRAM (Dynamic Random Access Memory) cell formed in a SOI (Silicon On Insulator) structure will now be described with reference to FIG. 14.

An insulation layer 2 is formed on a p-type first semiconductor layer 1. A p-type second semiconductor layer 3 is formed on the insulation layer 2. A body portion 4, a first impurity region 6, a second impurity region 7, and an isolation region 8 are provided in the second semiconductor layer 3. The first impurity region 6 and the second impurity region 7 interpose the body portion 4 therebetween.

A word line 10 is formed above the body portion 4 With a gate insulation film 9 interposed therebetween. A bit line 13 is connected to the first impurity region 6 through a wiring layer 12. A cylindrical storage node 14 is connected to the second impurity region 7. A dielectric film 15 is formed along the surface of the storage node 14. A cell plate 16 is formed in the cylindrical portion of the storage node 14 with the dielectric film 15 interposed therebetween. The storage node 14, the dielectric film 15 and the cell plate 16 form a capacitor. The second semiconductor layer 3 is covered with an interlayer insulation film 11.

Hereinafter, a method for manufacturing a DRAM cell having the above structure will be described briefly with reference to FIGS. 15 to 17. A SIMOX (Separation by IMplanted OXygen) method is known as a process for forming the SOI structure. However, there is a limit in the SIMOX method in terms of microfabrication. A lamination method is also known as a process for forming the SOI structure. A method for manufacturing a DRAM cell by using the lamination method will now be described.

Referring to FIG. 15, the surface of a first semiconductor substrate 1A is oxidized to form the insulation layer 2. Referring to FIG. 16, a second semiconductor substrate 1B is then laminated to the first semiconductor substrate 1A with the insulation layer 2 interposed therebetween.

Referring to FIG. 17, a surface of the first semiconductor substrate 1A located opposite to that facing the second semiconductor substrate 1B is removed. As a result, the first semiconductor layer 1 and the second semiconductor layer 3 are formed. The first semiconductor layer 1 is formed from the second semiconductor substrate 1B, and the second semiconductor layer 3 is formed from the first semiconductor substrate 1A. By using known technology, a semiconductor storage element is then formed on the surface of the first semiconductor substrate 1A exposed as a result of removing the surface of the first semiconductor substrate 1A.

The DRAM cell in the SOI structure thus formed has the following advantages:

(1) A small junction area between the storage node 14 and the substrate reduces junction leakage, resulting in improved pause refresh characteristics;

(2) A small junction capacity of the bit line 13 reduces the bit-line capacity (CB), allowing for an increased read margin;

(3) A small parasitic capacitance of the wirings enables high-speed operation;

(4) Excellent sub-threshold characteristics and a small substrate effect enable low-voltage operation; and (5) Very good soft-error resistance.

Thus, producing the DRAM cell in the SOI structure enables manufacturing of a low power consumption DRAM having a long data holding time and capable of implementing high-speed operation even with a low voltage.

However, when the DRAM cell is produced in the SOI structure, the potential of the body portion in the SOI structure is in a floating state. Therefore, holes generated near the drain by impact ionization are accumulated in the floating region under the body portion. The holes thus accumulated raise a lead electrode, increasing sub-threshold leakage. Such a body floating effect degrades disturb refresh characteristics.

Accordingly, the body portion must have a fixed potential. In order to fix the potential of the body portion, an active region 4A for a body contact 30 must be added (enlarged) in the memory cell layout, as shown in FIGS. 18A and 18B. This increases the layout area as compared to the case where the DRAM memory cell is produced with a bulk structure.

Moreover, a DRAM cell must be produced by using a method for reducing sub-threshold leakage in order to prevent degradation in disturb refresh characteristics. Examples of the method for reducing sub-threshold leakage are as follows:

(1) Negative-voltage Word Line Method

In this method, an inactive access transistor (a DRAM memory cell transistor) has a potential lower than 0 V so that the gate-source voltage VGS of the access transistor becomes negative. The sub-threshold leakage is thus reduced.

(2) Boosted Sense Ground Method

In this method, the ground voltage VSS of a sense amplifier is a positive voltage so that the gate-source voltage VGS of an inactive access transistor becomes negative. The sub-threshold leakage is thus reduced.

SUMMARY OF THE INVENTION

It is an object of the present invention to provide a semiconductor memory device that enables improvement in operation performance without increasing the layout area even when a DRAM cell is formed in a SOI structure, and a manufacturing method thereof.

A semiconductor memory device according to one aspect of the present invention includes a first semiconductor layer, an insulation layer formed on the first semiconductor layer, a second semiconductor layer formed on the insulation layer, and a semiconductor storage element formed on the second semiconductor layer. A body portion, a first impurity region and a second impurity region are formed in the second semiconductor layer so that the first impurity region and the second impurity region interpose the body portion therebetween. A potential clamping region for connecting the second semiconductor layer with the first semiconductor layer is formed in the insulation layer in order to fix a potential of the body portion to a potential of the first semiconductor layer.

This structure enables the potential of the body portion to be fixed to the same value as that of the first semiconductor layer by the potential clamping region without increasing the layout area of the body portion. Moreover, this structure eliminates the body floating effect, allowing for improvement in operation characteristics of the semiconductor memory device.

Preferably, the potential clamping region is formed at a position approximately under the body portion. More preferably, the potential clamping region is formed in a whole region under the body portion.

This structure reduces junction leakage, allowing for improvement in pause refresh characteristics.

Preferably, a bit line of the semiconductor storage element is connected to the first impurity region, and the potential clamping region is formed at a position approximately under the first impurity region. This structure reduces a bit-line capacity, allowing for an increased read margin.

Preferably, a capacitor of the semiconductor storage element is connected to the second impurity region, and the capacitor is a trench-type capacitor embedded in the insulation layer and the second semiconductor layer. In this structure, a storage node in the substrate is surrounded by the insulator, enabling reduction in junction leakage. Moreover, this structure enables the difference in level at the substrate surface to be reduced.

Preferably, the capacitor includes a stacked-type capacitor stacked above the second semiconductor layer. This structure allows for an increased memory cell capacity.

Preferably, the semiconductor storage element is formed with a circuit based on a negative-voltage word line method. Preferably, the semiconductor storage element is formed with a circuit based on a boosted sense ground method. These structures enables further improvement in disturb refresh characteristics.

In a method for manufacturing a semiconductor memory device according to another aspect of the present invention, a mask having a prescribed shape is provided at a prescribed position above a first semiconductor substrate. A surface of the first semiconductor substrate is oxidized by using the mask, thereby forming an insulation layer in a region that is not covered by the mask. A second semiconductor substrate is then laminated to the first semiconductor substrate with the insulation layer interposed therebetween.

Thereafter, a surface of the first semiconductor substrate located opposite to that facing the second semiconductor substrate is removed. A semiconductor storage element is then formed at a surface of the first semiconductor substrate exposed as a result of removing the surface of the first semiconductor substrate.

In the semiconductor memory device manufactured by the above method, the potential clamping region of the first semiconductor substrate, i.e., a region having no insulation layer formed therein, enables the potential of the body portion to be fixed to the same value as that of the first semiconductor layer of the second semiconductor substrate without increasing the layout area of the body portion.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a cross-sectional view of the structure of a conventional DRAM cell.

FIGS. 15 to 17 are cross-sectional views illustrating first to third steps of a conventional method for manufacturing a DRAM cell, respectively.

DESCRIPTION OF THE PREFERRED EMBODIMENTS

Hereinafter, embodiments of the present invention will be described with reference to the accompanying drawings.

First Embodiment

A semiconductor memory device and a manufacturing method thereof according to the first embodiment will now be described with reference to FIGS. 1 to 5.

(Structure of DRAM Cell)

Figure 1:
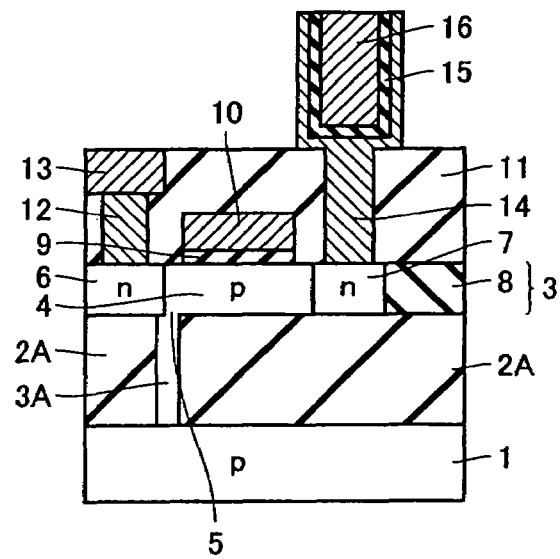
FIG. 1 is a cross-sectional of the structure of a DRAM cell according to a first embodiment of the present invention.

First, the structure of a DRAM cell in the present embodiment will be described with reference to FIG. 1. An insulation layer 2A is formed on a p-type first semiconductor layer 1. A p-type second semiconductor layer 3 is formed on the insulation layer 2A. A body portion 4, a first impurity region 6, a second impurity region 7, and an isolation region 8 are provided in the second semiconductor layer 3. The first impurity region 6 and the second impurity region 7 interpose the body portion 4 therebetween.

A potential clamping region 3A having no insulation layer formed therein is provided in the insulation layer 2A. More specifically, the potential clamping region 3A is formed under the body portion 4 at a position near the first impurity region 6, and extends to the first semiconductor layer 1. A body fixing portion 5 is formed in the boundary region between the body portion 4 and the potential clamping region 3A. The potential clamping region 3A electrically connects the body portion 4 to the first semiconductor layer 1, so that the body portion 4 and the first semiconductor layer 1 have the same potential.

A word line 10 is formed above the body portion 4 with a gate insulation film 9 interposed therebetween. A bit line 13 is connected to the first impurity region 6 through a wiring layer 12. A cylindrical storage node 14 is connected to the second impurity region 7. A dielectric film 15 is formed along the surface of the storage node 14. A cell plate 16 is formed in the cylindrical portion of the storage node 14 with the dielectric film 15 interposed therebetween. The storage node 14, the dielectric film 15 and the cell plate 16 form a capacitor. The second semiconductor layer 3 is covered with an interlayer insulation film 11.

(Manufacturing Method of DRAM Cell)

Hereinafter, a method for manufacturing a DRAM cell having the above structure will be described briefly with reference to FIGS. 2 to 5. A SIMOX method is known as a process for forming the SOI structure. However, there is a limit in the SIMOX method in terms of microfabrication. A lamination method is also known as a process for forming the SOI structure. A method for manufacturing a DRAM cell by using the lamination method will now be described. The same applies to each of the following embodiments.

Figure 2:
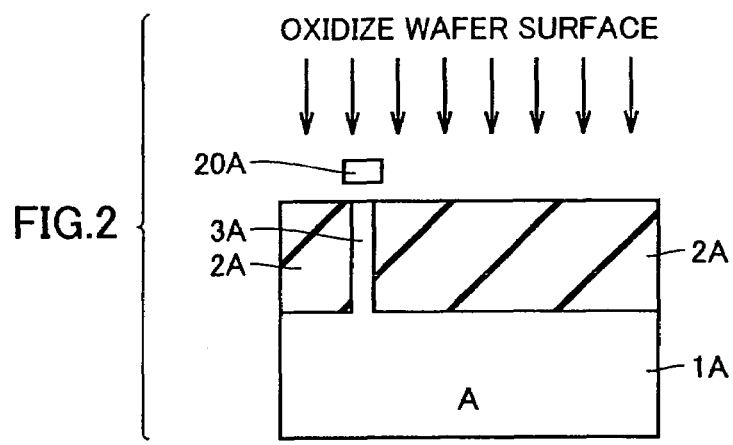
FIGS. 2 to 5 are cross-sectional views illustrating first to fourth steps of a method for manufacturing a DRAM cell according to the first embodiment, respectively.

Referring to FIG. 2, a mask 20A having a prescribed shape is provided at a prescribed position above a first semiconductor substrate 1A. The surface of the first semiconductor substrate 1A is oxidized by using the mask 20A. As a result, the insulation layer 2A is formed in the region that is not covered by the mask 20A. No insulation layer 2A is formed in the region covered by the mask 20A. This region serves as a potential clamping region 3A.

Figure 3:
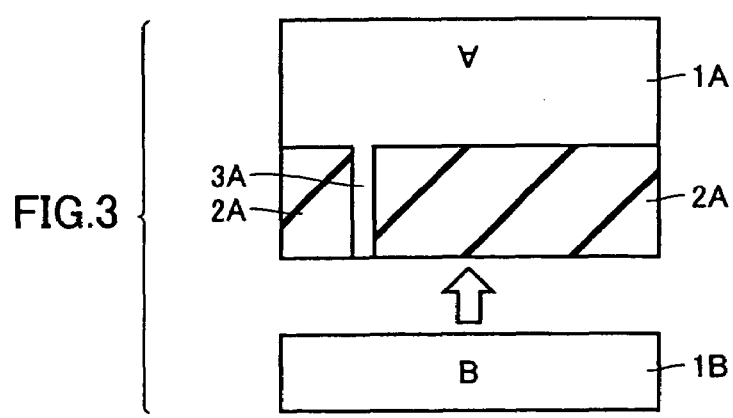
Figure 4:
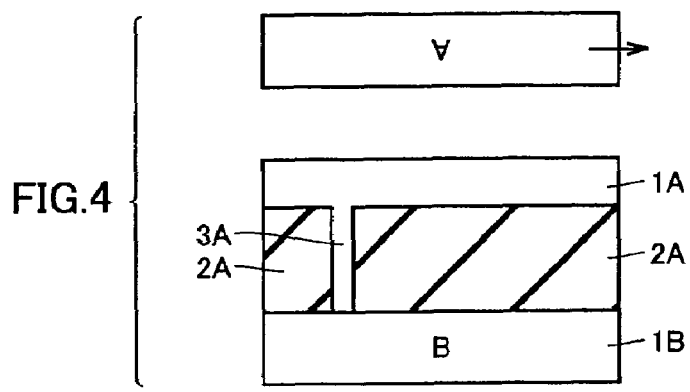
Figure 5:
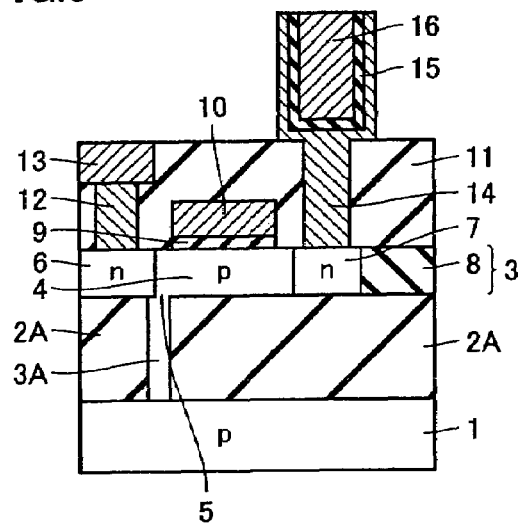

Referring to FIG. 3, a second semiconductor substrate 1B is then laminated to the first semiconductor substrate 1A with the insulation layer 2A interposed therebetween. Referring to FIG. 4, a surface of the first semiconductor substrate 1A located opposite to that facing the second semiconductor substrate 1B is removed. As a result, the first semiconductor layer 1 and the second semiconductor layer 3 are formed. The first semiconductor layer 1 is formed from the second semiconductor substrate 1B, and the second semiconductor layer 3 is formed from the first semiconductor substrate 1A. Referring to FIG. 5, by using known technology, a semiconductor storage element is formed on the surface of the first semiconductor substrate 1A exposed as a result of removing the surface of the first semiconductor substrate 1A.

In order to partially deplete the body portion 4 under the channel, the impurity concentration under the channel is about $5 \times 10^{-17}/cm^3$, and the impurity concentration of the first impurity region 6 and the second impurity region 7 is about $1 \times 10^{-20}/cm^3$. The gate insulation film 9 has a thickness of about 7.5 nm, the second semiconductor layer 3, i.e., a SOI portion, has a thickness of about 100 nm, and the insulation layer 2A has a thickness of about 400 nm.

(Effects)

According to the DRAM cell of the SOI structure and the manufacturing method thereof in the present embodiment, degradation in disturb refresh characteristics due to the body floating effect can be suppressed while maintaining characteristics of the SOI structure such as reduced junction leakage, reduced bit-line capacity and reduced substrate effect.

Moreover, the DRAM cell of the SOI structure has the same layout area as that of the DRAM cell of the bulk structure. This enables manufacturing of a low power consumption DRAM having a long data holding time and capable of implementing high-speed operation-even with a low voltage.

Second Embodiment

Figure 6:
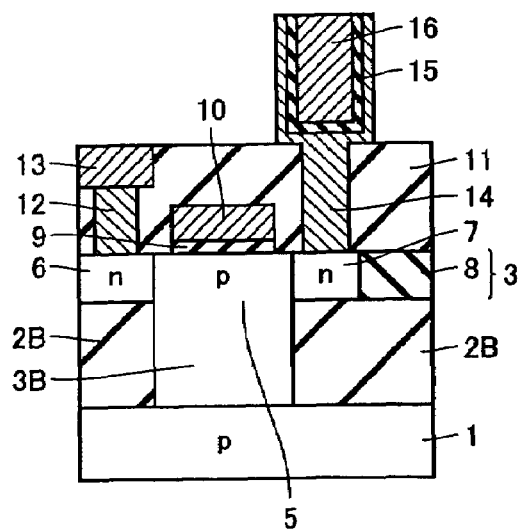
FIG. 6 is a cross-sectional view of the structure of a DRAM cell according to a second embodiment of the present invention.

Hereinafter, a semiconductor memory device and a manufacturing method thereof according to the second embodiment will be described with reference to FIGS. 6 and 7.

(Structure of DRAM Cell)

First, the structure of the DRAM cell according to the second embodiment will be described with reference to FIG. 6. The structure of the DRAM cell of the second embodiment is basically the same as that of the first embodiment. The. DRAM cell of the second embodiment is different from that of the first embodiment in that a potential clamping region 3B having no insulation layer formed therein and extending to the first semiconductor layer 1 is provided in the whole region under the body portion 4, and an insulation layer. 2B is formed only under the storage node 14 and the bit line 13.

(Manufacturing Method of DRAM Cell)

Hereinafter, a method for manufacturing a DRAM cell having the above structure will be described briefly with reference to FIG. 7. The manufacturing method of the second embodiment is different from that of the first embodiment in the manufacturing method of the potential damping region 3B and the insulation layer 2B. The lamination method for producing the SOI structure and the manufacturing method of the semiconductor storage element are the same as those of the first embodiment.

Figure 7:
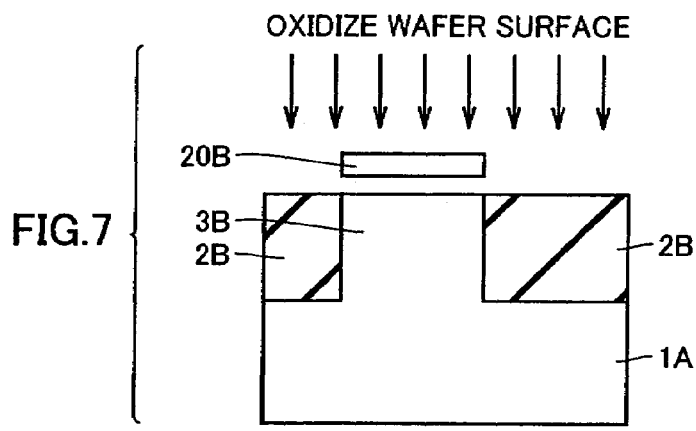
FIG. 7 is a cross-sectional view illustrating a method for manufacturing a DRAM cell according to the second embodiment.

First, as shown in FIG. 7, a mask 20B having a prescribed shape is provided at a prescribed position above the first semiconductor substrate 1A. The surface of the first semiconductor substrate 1A is oxidized by using the mask 20B. As a result, an insulation layer 2B is formed in the region that is not covered by the mask 20B. No insulation layer 2B is formed in the region covered by the mask 20B. This region serves as a potential clamping region 3B. Thereafter, the manufacturing steps of FIGS. 3 to 5 are conducted. As a result, a DRAM cell having a cross section of FIG. 6 is obtained.

(Effects)

According to the DRAM cell of the SOI structure and the manufacturing method thereof in the present embodiment, the reduced substrate effect, i.e., one of the characteristics of the SOI structure, cannot be obtained as opposed to the first embodiment. However, the present embodiment facilitates manufacturing of the DRAM cell in terms of microfabrication.

Like the DRAM cell of the first embodiment, degradation in disturb refresh characteristics due to the body floating effect can be suppressed while maintaining the characteristics of the SOI structure such as reduced junction leakage and reduced bit-line capacity.

Third Embodiment

Figure 8:
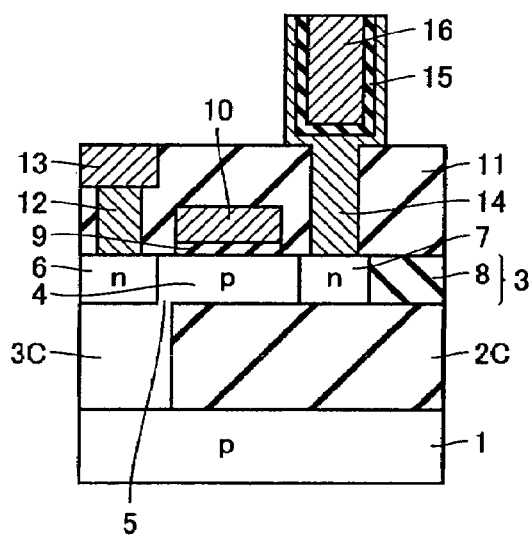
FIG. 8 is a cross-sectional view of the structure of a DRAM cell according to a third embodiment of the present invention.

Hereinafter, a semiconductor memory device and a manufacturing method thereof according to the third embodiment will be described with reference to FIGS. 8 and 9.

(Structure of DRAM Cell)

First, the structure of the DRAM cell according to the third embodiment will be described with reference to FIG. 8. The structure of the DRAM cell is basically the same as that of the first embodiment. The DRAM cell of the third embodiment is different from that of the first embodiment in that a potential clamping region 3C having no insulation layer formed therein is provided in the whole region under the bit line 13 and a part of the region under the body portion 4, and an insulation layer 2C is formed under the storage node 14.

(Manufacturing Method of DRAM Cell)

Hereinafter, a method for manufacturing a DRAM cell having the above structure will be described briefly with reference to FIG. 9. The manufacturing method of the third embodiment is different from that of the first embodiment in the manufacturing method of the potential clamping region 3C and the insulation layer 2C. The lamination method for producing the SOI structure and the manufacturing method of the semiconductor storage element are the same as those of the first embodiment.

Figure 9:
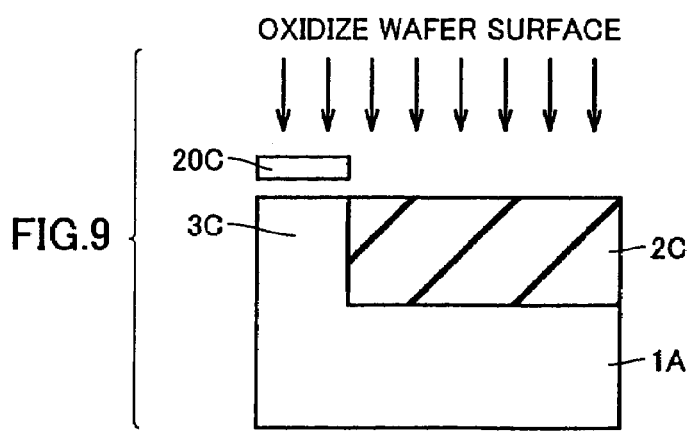
FIG. 9 is a cross-sectional view illustrating a method for manufacturing a DRAM cell according to the third embodiment.

First, as shown in FIG. 9, a mask 20C having a prescribed shape is provided at a prescribed position above the first semiconductor substrate 1A. The surface of the first semiconductor substrate 1A is oxidized by using the mask 20C. As a result, an insulation layer 2C is formed in the region that is not covered by the mask 20C. No insulation layer 2C is formed in the region covered by the mask 20C. This region serves as a potential clamping region 3C. Thereafter, the manufacturing steps of FIGS. 3 to 5 are conducted. As a result, a DRAM cell having a cross section of FIG. 8 is obtained.

(Effects)

According to the DRAM cell of the SOI structure and the manufacturing method thereof in the present embodiment, the reduced bit-line capacity, i.e., one of the characteristics of the SOI structure, cannot be obtained as opposed to the first embodiment. However, the present embodiment facilitates manufacturing of the DRAM cell in terms of microfabrication.

Like the DRAM cell of the first embodiment, degradation in disturb refresh characteristics due to the body floating effect can be suppressed while maintaining the characteristics of the SOI structure such as reduced junction leakage and reduced substrate effect.

Note that the present invention is not limited to the structure described in the first to third embodiments as long as a potential clamping region having no insulation layer formed therein is provided in a part of the region under the body portion 4 and the potential of the body portion 4 is fixed in that potential clamping region.

Fourth Embodiment

Hereinafter, a semiconductor memory device and a manufacturing method thereof according to the fourth embodiment will be described with reference to FIG. 10.

(Structure of DRAM Cell)

In the first to third embodiments, a cylindrical capacitor is provided as a semiconductor storage element at the surface of the first semiconductor substrate 1A exposed as a result of removing the surface of the first semiconductor substrate 1A. The DRAM cell of the fourth embodiment is characterized in that a trench-type capacitor is provided as a semiconductor storage element.

Figure 10:
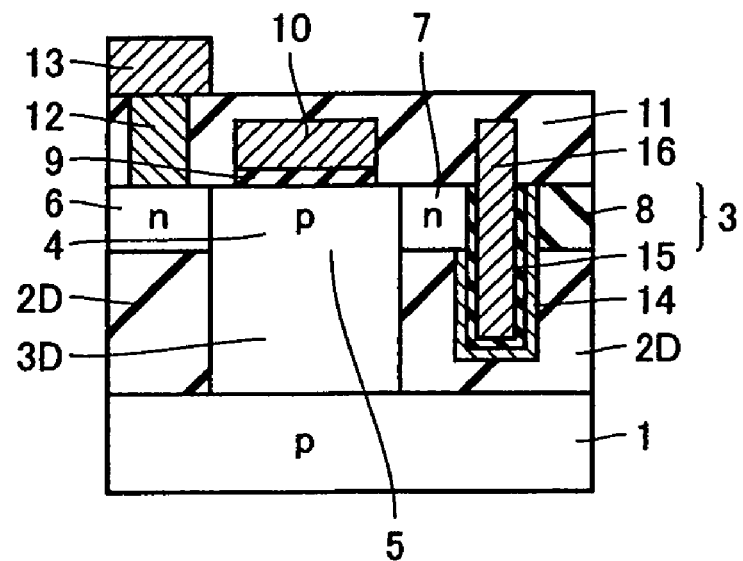
FIG. 10 is a cross-sectional view of the structure of a DRAM cell according to a fourth embodiment of the present invention.

More specifically, as shown in FIG. 10, an insulation layer 2D is formed on a p-type first semiconductor layer 1, and a p-type second semiconductor layer 3 is formed on the insulation layer 2D. A body portion 4, a first impurity region 6, a second impurity region 7 and an isolation region 8 are provided in the second semiconductor layer 3. The first impurity region 6 and the second impurity region 7 interpose the body portion 4 therebetween.

Like the second embodiment, a potential clamping region 3D having no insulation layer formed therein and extending to the first semiconductor layer 1 is provided in the whole region of the insulation layer 2D located under the body portion 4. A body fixing portion 5 is formed in the boundary region between the body portion 4 and the potential clamping region 3D.

A word line 10 is formed above the body portion 4 with a gate insulation film 9 interposed therebetween. A bit line 13 is connected to the first impurity region 6 through a wiring layer 12. A storage node 14 is connected to the second impurity region 7. The storage node 14 is embedded in the insulation layer 2D. A dielectric film 15 is formed along the surface of the storage node 14. A cell plate 16 is formed in the trench portion defined by the dielectric film 15. The storage node 14, the dielectric film 15 and the cell plate 16 form a trench-type capacitor. The second semiconductor layer 3 is covered with an interlayer insulation film 11.

Note that, in the present embodiment, the trench-type capacitor is applied to the structure of the second embodiment. However, the trench-type capacitor may be applied to the structure of the first or third embodiment.

(Manufacturing Method of DRAM Cell)

A DRAM cell having the above structure can be manufactured by conducting the same steps as those of FIGS. 2 to 4 (see also FIG. 7) and then applying known technology for forming a trench-type capacitor.

(Effects)

When a trench-type capacitor is applied to the first to third embodiments, the storage node 14 is formed within the substrate. This increases the junction area, thereby possibly degrading pause refresh characteristics.

However, according to the DRAM cell of the SOI structure and the manufacturing method thereof in the fourth embodiment, the storage node 14 is surrounded by the insulation layer 2D, as shown in FIG. 10. Therefore, the junction leakage is approximately the same as that of a stacked-type capacitor. Moreover, the structure of the fourth embodiment reduces the difference in level at the surface of the semiconductor storage element.

Fifth Embodiment

Hereinafter, a semiconductor memory device and a manufacturing method thereof according to the fifth embodiment will be described with reference to FIG. 11.

(Structure of DRAM Cell)

The DRAM cell of the fifth embodiment is characterized by a stacked-trench-type capacitor structure. In other words, in the fifth embodiment, a stacked-type capacitor is added to the trench-type capacitor of the fourth embodiment.

Figure 11:
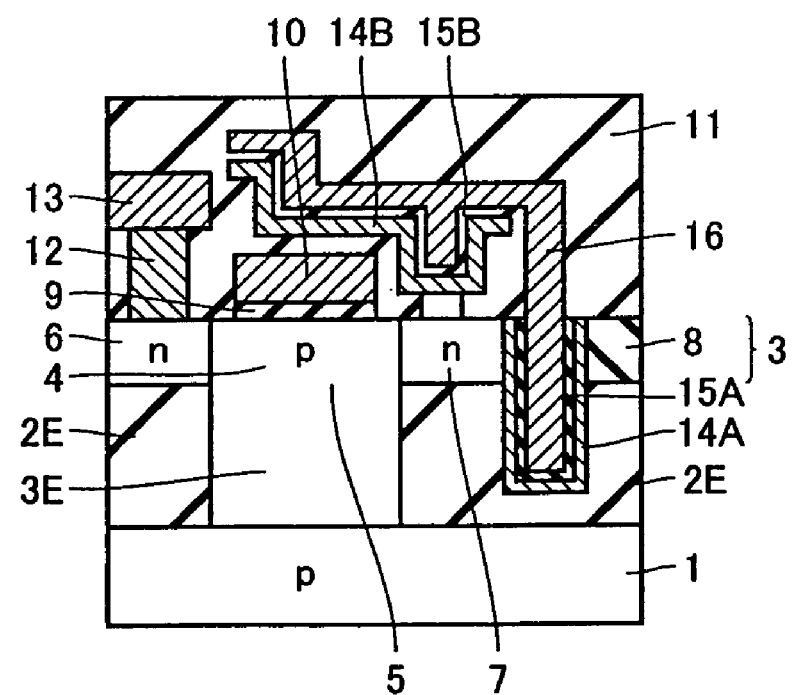
FIG. 11 is a cross-sectional view of the structure of a DRAM cell according to a fifth embodiment of the present invention.

More specifically, as shown in FIG. 11, an insulation layer 2E is formed on a p-type first semiconductor layer 1, and a p-type second semiconductor layer 3 is formed on the insulation layer 2E. A body portion 4, a first impurity region 6, a second impurity region 7 and an isolation region 8 are provided in the second semiconductor layer 3. The first impurity region 6 and the second impurity region 7 interpose the body portion 4 therebetween.

Like the second embodiment, a potential clamping region 3E having no insulation layer formed therein and extending to the first semiconductor layer 1 is provided in the whole region of the insulation layer 2E located under the body portion 4. A body fixing portion 5 is formed in the boundary region between the body portion 4 and the potential clamping region 3E.

A word line 10 is formed above the body portion 4 with a gate insulation film 9 interposed therebetween. A bit line 13 is connected to the first impurity region 6 through a wiring layer 12. A first storage node 14A is connected to the second impurity region 7. The first storage node 14A is embedded in the insulation layer 2E. A dielectric film 15A is formed along the surface of the first storage node 14A. A cell plate 16 is formed in the trench portion defined by the dielectric film 15A. The first storage node 14A, the dielectric film 15A and the cell plate 16 form a trench-type capacitor.

A second storage node 14B is connected to the second impurity region 7. The second storage node 14B is formed above the second impurity region 7. A dielectric film 15B is formed along the surface of the second storage node 14B. The cell plate 16 extends along the surface of the dielectric film 15B. The second storage node 14B, the dielectric film 15B and the cell plate 16 form a stacked-type capacitor. The second semiconductor layer 3 is covered with an interlayer insulation film 11.

Note that, in the present embodiment, the stacked-trench-type capacitor is applied to the structure of the second embodiment. However, the stacked-trench-type capacitor may be applied to the structure of the first or third embodiment.

(Manufacturing Method of DRAM Cell)

A DRAM cell having the above structure can be manufactured by conducting the same steps as those of FIGS. 2 to 4 (see also FIG. 7) and then applying known technology for forming a stacked-trench-type capacitor.

(Effects)

According to the DRAM cell of the SOI structure and the manufacturing method thereof in the present embodiment, the memory cell capacity can be increased as compared to the DRAM cell of the fourth embodiment.

Note that the potential clamping region in each of the above embodiments is shown by way of example only. The potential clamping region may have any structure as long as a region having no insulation layer formed therein is provided in a part of the region under the body portion 4 and the potential of the body portion 4 is fixed in that region.

The DRAM cells of the first to third embodiments include a cylindrical stacked-type capacitor, the DRAM cell of the fourth embodiment includes a trench-type capacitor, and the DRAM cell of the fifth embodiment includes a stacked-trench-type capacitor. However, the form of the capacitor is not limited to those described above.

Sixth Embodiment

Figure 12:
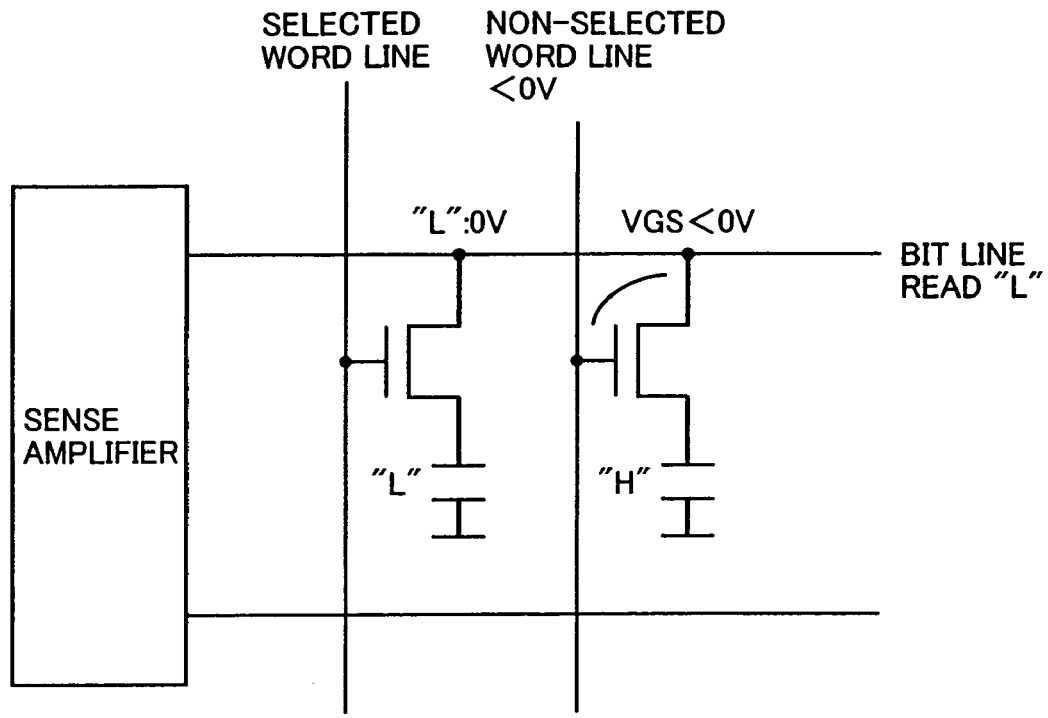
FIG. 12 is a circuit diagram of the circuit structure of a DRAM cell according to a sixth embodiment of the present invention.

Hereinafter, a semiconductor memory device according to the sixth embodiment will be described with reference to FIG. 12.

The sixth embodiment is characterized in that a negative-voltage word line method is used in the DRAM cell having the structure of the first to fifth embodiments. In other words, the circuit structure of FIG. 12 is applied to the DRAM cell having the structure of the first to fifth embodiments.

The negative-voltage word line method will now be described with reference to FIG. 12. A non-selected word line normally has a potential of 0 V. In this method, however, a non-selected word line has a negative potential. It is now assumed that a memory cell of interest stores "H" data therein and "L" data is read from a memory cell on the same bit line. In this case, the gate-source voltage VGS of an access transistor is normally 0 V. In the negative-voltage word line method, however, the gate-source voltage VGS of an access transistor is negative. As a result, sub-threshold leakage of the access transistor is reduced, improving disturb refresh characteristics.

(Effects)

The above structure enables reduction in sub-threshold leakage and thus improvement in disturb refresh characteristics. Therefore, by further reducing the substrate potential, junction leakage is reduced. This enables manufacturing of a DRAM cell having improved retention characteristics.

By applying the negative-voltage word line method to the DRAM cell of the SOI structure of the first to fifth embodiments, the body floating effect, which is problematic in the SOI structure, is eliminated while maintaining the characteristics of the SOI structure such as improved pause refresh characteristics. Accordingly, the use of the negative-voltage word line method enables manufacturing of a DRAM cell having excellent retention characteristics.

Seventh Embodiment

Figure 13:
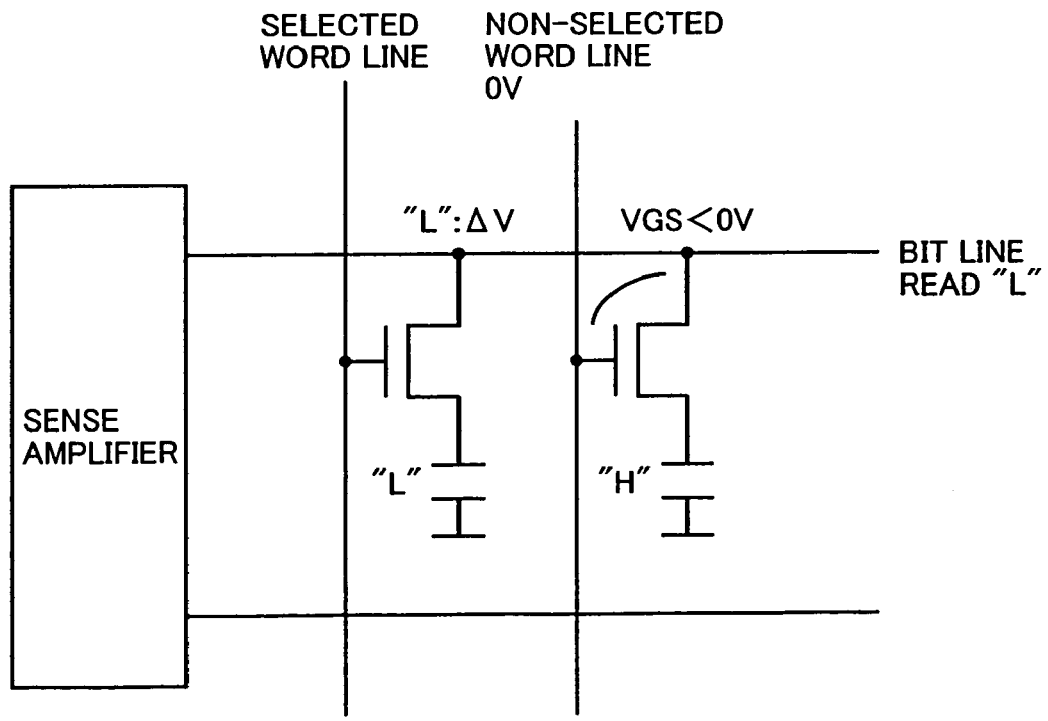
FIG. 13 is a circuit diagram of the circuit structure of a DRAM cell according to a seventh embodiment of the present invention.
Figure 17:
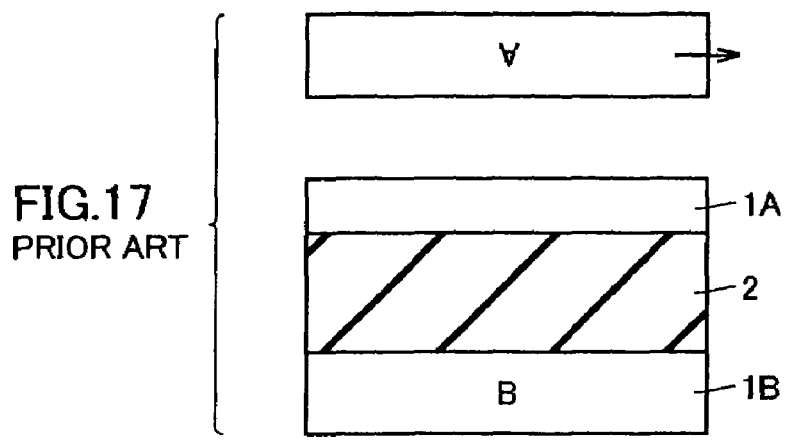
Figure 18A:
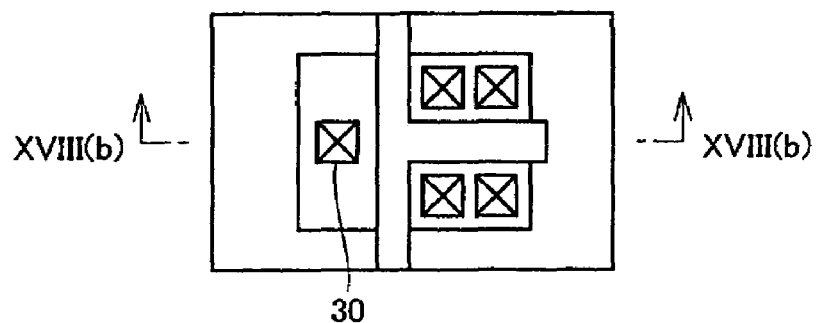
FIG. 18A is a plan view of the layout of a conventional DRAM cell.
Figure 18B:
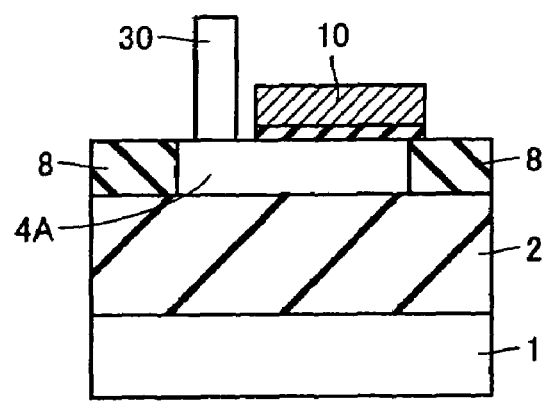
FIG. 18B is a cross-sectional view taken along line XVIII(B)-XVIII(B) of FIG. 18A.

Hereinafter, a semiconductor memory device according to the seventh embodiment will be described with reference to FIG. 13.

The seventh embodiment is characterized in that a boosted sense ground method is used in the DRAM cell having the structure of the first to fifth embodiments. In other words, the circuit structure of FIG. 13 is applied to the DRAM cell having the structure of the first to fifth embodiments.

The boosted sense ground method will now be described with reference to FIG. 13. The sense ground potential is normally 0 V. In this method, however, the sense ground potential is a positive potential of Δ V (e.g., 0.5 V). It is now assumed that a memory cell of interest stores "H" data therein and "L" data is read from a memory cell on the same bit line. In this case, the gate-source voltage VGS of an access transistor is normally 0 V. In the boosted sense ground method, however, the gate-source voltage VGS of an access transistor is negative. As a result, sub-threshold leakage of the access transistor is reduced, improving disturb refresh characteristics.

(Effects)

The above structure enables reduction in sub-threshold leakage and thus improvement in disturb refresh characteristics. Therefore, by further reducing the substrate potential, junction leakage is reduced. This enables manufacturing of a DRAM cell having improved retention characteristics.

By applying the boosted sense ground method to the DRAM cell of the SOI structure of the first to fifth embodiments, the body floating effect, which is problematic in the SOI structure, is eliminated while maintaining the characteristics of the SOI structure such as improved pause refresh characteristics. Accordingly, the use of the boosted sense ground method enables manufacturing of a DRAM cell having excellent retention characteristics.

Note that the disturb refresh characteristics are improved by the negative-voltage word line method in the sixth embodiment and by the boosted sense ground method in the seventh embodiment. However, the present invention is not limited to this. Any circuit structure using another method for improving the disturb refresh characteristics may be used.

The semiconductor memory device and the manufacturing method thereof according to the present invention enables the potential of the body portion to be fixed to the same value as that of the first semiconductor layer by the potential clamping region without increasing the layout area of the body portion. Moreover, the body floating effect is eliminated, allowing for improvement in operation characteristics of the semiconductor memory device.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A method for manufacturing a semiconductor memory device, comprising the steps of:

providing a mask having a prescribed shape at a prescribed position above a first semiconductor substrate, and oxidizing a surface of said first semiconductor substrate by using said mask, thereby forming an insulation layer in a region that is not covered by said mask;

laminating a second semiconductor substrate to said first semiconductor substrate with said insulation layer interposed therebetween, thereby connecting said second semiconductor substrate and a semiconductor region that is included in said first semiconductor substrate and that is a region where said insulation layer is not formed;

removing a surface of said first semiconductor substrate located opposite to that facing said second semiconductor substrate; and forming a semiconductor storage element at a surface of said first semiconductor substrate exposed as a result of removing said surface of said first semiconductor substrate.

* * * * *